(12) United States Patent
Ng et al.

(10) Patent No.: US 9,823,565 B2
(45) Date of Patent: Nov. 21, 2017

(54) PHOTOIMAGEABLE COMPOSITIONS CONTAINING PHOTOBASE GENERATORS

(71) Applicant: PROMERUS, LLC, Brecksville, OH (US)

(72) Inventors: Hendra Ng, Brecksville, OH (US); Wei Zhang, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/042,220

(22) Filed: Feb. 12, 2016

(65) Prior Publication Data

US 2016/0238931 A1    Aug. 18, 2016

Related U.S. Application Data

(60) Provisional application No. 62/117,769, filed on Feb. 18, 2015.

(51) Int. Cl.
| | | |
|---|---|---|
| *G03F 7/038* | (2006.01) | |
| *G03F 7/075* | (2006.01) | |
| *G03F 7/004* | (2006.01) | |

(52) U.S. Cl.
CPC .......... *G03F 7/038* (2013.01); *G03F 7/0045* (2013.01); *G03F 7/0046* (2013.01); *G03F 7/0382* (2013.01); *G03F 7/0751* (2013.01)

(58) Field of Classification Search
None
See application file for complete search history.

(56) References Cited

U.S. PATENT DOCUMENTS

| | | | |
|---|---|---|---|
| 2004/0023150 A1 | 2/2004 | Feiring | |
| 2006/0020068 A1* | 1/2006 | Elce .................. | G03F 7/0382 524/356 |
| 2007/0249484 A1* | 10/2007 | Benkhoff ............ | B01J 31/0205 502/5 |
| 2009/0189277 A1 | 7/2009 | Apanius et al. | |
| 2013/0181199 A1* | 7/2013 | Apanius ............... | C08F 232/08 257/40 |
| 2014/0087293 A1 | 3/2014 | Kandanarachchi et al. | |

FOREIGN PATENT DOCUMENTS

| | | |
|---|---|---|
| EP | 1 246 013 A2 | 10/2002 |
| WO | WO 02/093263 A1 | 11/2002 |
| WO | WO 2016/133794 A1 * | 8/2016 |

OTHER PUBLICATIONS

Li et al , "Study on synthesis and photoactivity of N-substituted diazabicyclononane derivatives with different substituents", Internatioal Journal of Adhesion & Adhesives, 57, (Year2015) pp. 118-124 available on line Dec. 9, 2014.*

* cited by examiner

*Primary Examiner* — Cynthia Hamilton
(74) *Attorney, Agent, or Firm* — Balaram Gupta (57) ABSTRACT

Embodiments in accordance with the present invention encompass negative-tone, solvent developable, self-imageable polymer compositions containing photobase generators which are useful for forming films that can be patterned to create structures for microelectronic devices, microelectronic packaging, microelectromechanical systems, optoelectronic devices and displays.

5 Claims, 1 Drawing Sheet

PHOTOIMAGEABLE COMPOSITIONS CONTAINING PHOTOBASE GENERATORS

CROSS REFERENCE TO RELATED APPLICATIONS

This application claims the benefit of U.S. Provisional Application No. 62/117,769, filed Feb. 18, 2015, which is incorporated herein by reference in its entirety.

BACKGROUND OF THE INVENTION

Field of the Invention

Embodiments in accordance with the present invention relate generally to photoimageable compositions containing certain photobase generators (PBG) for forming microelectronic and/or optoelectronic devices and assemblies thereof, and more specifically to compositions encompassing polynorbornene (PNB) polymers having norbornene-type repeating units that exhibit improved patterning.

Description of the Art

Organic polymer materials are increasingly being used in the microelectronics and optoelectronics industries for a variety of applications. For example, the uses for such organic polymer materials include interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

While certain of the currently available organic photosensitive compositions are used in some of the aforementioned applications, there is still a need for organic photosensitive compositions which feature improved patterning properties especially in such applications as RDL, chip stacking/bonding and CMOS, where the organic polymer materials retain their photo-patterning integrity by reduced polymer reflow during high temperature curing.

Accordingly, there is still a need to develop self imageable photosensitive polymer compositions which feature improved imageability. Further, such improved imageability should also improve various other properties, such as, i) maintain pattern integrity after cure, ii) improve bond adhesion, iii) minimize solvent swelling, i.e., improve chemical resistance, and iv) improve mechanical properties, just to name a few.

SUMMARY OF THE INVENTION

It has now been found that by employing a series of photobase generators (PBG), it is now possible to fabricate a semiconductor device which features improved imageability, maintain pattern integrity after cure, improved bond adhesion and improved solvent swelling, yet can be readily integrated into conventional applications, such as for example, CMOS image sensor (CIS) applications or redistribution layer (RDL) applications, and the like.

Accordingly, there is provided a photoimageable solvent developable negative tone to composition comprising:

a) a polymer having one or more repeating units of formula (IA) derived from a monomer of formula (I):

(IA)

(I)

wherein ∿∿ represents a position at which the bonding takes place with another repeat unit;

$R_1$ is $(C_6$-$C_{18})$alkyl; perfluoro$(C_1$-$C_{18})$alkyl; $(C_6$-$C_{10})$aryl $(C_1$-$C_6)$alkyl; —$(CH_2)_a$—$CO_2R_2$ where a is an integer from 0 to 4, and $R_2$ is selected from hydrogen and $(C_1$-$C_4)$alkyl;

a group of formula (A):

$$-(CH_2)_b-(OCH_2-CH_2)_c-OR \quad (A);$$

a group of formula (B):

(B)

and a group of formula (C):

(C)

wherein:

b is an integer from 0 to 10;

c is an integer 0, 1, 2, 3 or 4; and

R is hydrogen, linear or branched $(C_1$-$C_6)$alkyl, $(C_5$-$C_8)$cycloalkyl, $(C_6$-$C_{10})$aryl or $(C_7$-$C_{12})$aralkyl;

b) a photobase generator; and c) a carrier solvent.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "~~~" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_6)$alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "$(C_1-C_4)$alkoxy", "$(C_1-C_4)$thioalkyl" "$(C_1-C_4)$alkoxy$(C_1-C_4)$alkyl", "hydroxy$(C_1-C_4)$alkyl", "$(C_1-C_4)$alkylcarbonyl", "$(C_1-C_4)$alkoxycarbonyl $(C_1-C_4)$alkyl", "$(C_1-C_4)$alkoxycarbonyl", "amino$(C_1-C_4)$alkyl", "$(C_1-C_4)$alkylamino", "$(C_1-C_4)$alkylcarbamoyl$(C_1-C_4)$alkyl", "$(C_1-C_4)$dialkylcarbamoyl$(C_1-C_4)$alkyl" "mono- or di-$(C_1-C_4)$alkylamino$(C_1-C_4)$alkyl", "amino$(C_1-C_4)$alkylcarbonyl" "diphenyl$(C_1-C_4)$alkyl", "phenyl$(C_1-C_4)$alkyl", "phenylcarboyl$(C_1-C_4)$alkyl" and "phenoxy$(C_1-C_4)$alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_6)$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_6)$perfluoroalkoxy", is to be construed accordingly. It should further be noted that certain of the alkyl groups as described herein, such as for example, "$(C_1-C_6)$alkyl" may partially be fluorinated, that is, only portions of the hydrogen atoms in said alkyl group are replaced with fluorine atoms and shall be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{2-6}$alkenyl, $C_{1-6}$perfluoroalkyl, phenyl, hydroxy, —$CO_2H$, an ester, an amide, $C_1-C_6$alkoxy, $C_1-C_6$thioalkyl, $C_1-C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof. Similarly, microelectromechanical systems (MEMS) include microoptoelectromechanical systems (MOEMS).

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

It will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the organic field effect transistors (OFETs).

As used herein, the term "photobase generator" and similar terms, such as, "photo activated base generator" and "photo initiator" means any material which when exposed to suitable radiation generates one or more bases.

By the term, "a monomer repeat unit is derived" is meant that the polymeric repeating units are polymerized (formed) from, e.g., polycyclic norbornene-type monomers, wherein the resulting polymers are formed by 2,3 enchainment of norbornene-type monomers as shown below:

Accordingly, in accordance with the practice of this invention there is provided photoimageable solvent developable negative tone composition comprising:

a) a polymer having one or more repeating units of formula (IA) derived from a monomer of formula (I):

wherein ∼∼∼ represents a position at which the bonding takes place with another repeat unit;

$R_1$ is $(C_6-C_{18})$alkyl; perfluoro$(C_1-C_{18})$alkyl; $(C_6-C_{10})$aryl$(C_1-C_6)$alkyl; $-(CH_2)_a-CO_2R_2$ where a is an integer from 0 to 4, and $R_2$ is selected from hydrogen and $(C_1-C_4)$alkyl;

a group of formula (A):

$$-(CH_2)_b-(OCH_2-CH_2)_c-OR \qquad (A);$$

a group of formula (B):

and
a group of formula (C):

wherein:
b is an integer from 0 to 10;
c is an integer 0, 1, 2, 3 or 4; and
R is hydrogen, linear or branched ($C_1$-$C_6$)alkyl, ($C_5$-$C_8$) cycloalkyl, ($C_6$-$C_{10}$)aryl or ($C_7$-$C_{12}$)aralkyl;
b) a photobase generator; and
c) a carrier solvent.

The polymers employed in the photoimageable compositions of this invention can be synthesized by any of the procedures known to one skilled in the art. Generally, such polymers are prepared either by vinyl addition polymerization and/or free radical polymerization. Typically, vinyl additional polymers are made using a transition metal catalyst, such as for example, palladium, nickel, platinum, and the like. See for example, U.S. Pat. Nos. 5,929,181; 6,455,650; 6,825,307; and 7,101,654; pertinent portions of which are incorporated herein by reference.

In general, the polymer embodiments in accordance with the present invention encompass the above described one or more of the distinct type of repeating units of formula either (IA), as it will be seen below, various repeating units encompassed by such polymer embodiments are selected to provide properties to such polymer embodiments that are appropriate and desirable for the use for which such embodiments are directed, thus such polymer embodiments are tailorable to a variety of specific applications.

For example, polymer embodiments generally require at least one repeating unit directed to providing imageability. Thus distinct types of repeating units, represented by structural formula (IA) can include $R_1$ being a group of formula (B) as defined hereinabove. However, any of the other functional group which would bring about the desirable effect upon photoexposure can also be used. For example, a group of formula (B) which contains an epoxy group can effectively crosslink with other components in the composition so as to form high resolution images upon exposure to suitable actinic radiation. That is, the exposed regions are crosslinked and thus insoluble in the developer solvent to form the images. Other such functional groups may also include an ether and olefinic groups that can participate in a reaction with appropriately selected additives, or other repeating units that can lead to fix a negative-tone image via crosslinking.

When a polymer containing more than one repeat unit is used, such as for example, a polymer encompassing three distinct monomer repeat units of formula (IA), any molar ratios of such monomer units can be used to form such a terpolymer. Examples of such monomer molar ratio can range from 1:1:98 to 98:1:1 to 1:98:1 respectively. In some other embodiments such ratios include 30:40:30, 40:30:30, 40:40:20, 40:45:15, 40:50:10, 45:40:15, 45:35:20, 50:35:15, 50:40:10 or any such combination. Similarly, a polymer encompassing two distinct monomer repeat units of formula (IA), any molar ratios of such two monomer units can be used to form such a copolymer. Examples of such monomer molar ratio can range from 1:99 to 99:1 respectively. In some other embodiments such ratios include 10:90, 20:80, 30:70, 40:60, 50:50, 60:40, 70:30, 80:20, 90:10 or any such combination.

In general, it has now been found that a polymer containing the monomer repeat unit having an epoxy pendent group (generally of formula (B)) advantageously provides certain beneficial effect for the photosensitive composition of this invention. Thus, in some embodiments of this invention, the polymer used in the photosensitive composition of this invention contains a monomer repeat unit containing an epoxy pendent group from about 10 to 80 mol %, and in some other embodiments from 20 to 70 mol %. In some other embodiments the molar percent of first monomer repeat units of formula (IA) in the polymer may be from about 1 to 80 mol %, from about 10 to 80 mol % and in some other embodiments from about 20 to 70 mol %. In some other embodiments the molar percent of second distinct monomer repeat units of formula (B) in the polymer may be from about 1 to 80 mol %, from about 10 to 80 mol % and in some other embodiments from about 20 to 70 mol %.

Accordingly, any of the known monomers of formula (I) can be employed in this aspect of the invention. Representative examples of monomers of formula (I) include the following without any limitations:

5-methylbicyclo[2.2.1]hept-2-ene (MeNB)

5-ethylbicyclo[2.2.1]hept-2-ene (EtNB)

5-n-butylbicyclo[2.2.1]hept-2-ene (BuNB)

5-hexylbicyclo[2.2.1]hept-2-ene (HexNB)

5-octylbicyclo[2.2.1]hept-2-ene (OctNB)

5-decylbicyclo[2.2.1]hept-2-ene (DecNB)

5-trifluoromethylbicyclo[2.2.1]hept-2-ene ($CF_3$NB)

5-perfluoroethylbicyclo[2.2.1]hept-2-ene ($C_2F_5$NB)

-continued

5-n-perfluorobutylbicyclo[2.2.1]hept-2-ene (C$_4$F$_9$NB)

5-perfluorohexylbicyclo[2.2.1]hept-2-ene (C$_6$F$_{13}$NB)

5-perfluorooctylbicyclo[2.2.1]hept-2-ene (C$_8$F$_{17}$NB)

5-perfluorodecylbicyclo[2.2.1]hept-2-ene (C$_{10}$F$_{21}$NB)

norbornenyl-2-trifluoromethyl-3,3,3-trifluoropropan-2-ol (HFANB)

bicyclo[2.2.1]hept-5-en-2-ylmethyl acetate (MeOAcNB)

bicyclo[2.2.1]hept-5-en-2-ylmethanol (MeOHNB)

5-((2-(2-methoxyethoxy)ethoxy)methyl)bicyclo[2.2.1]hept-2-ene (NBTON)

1-(bicyclo[2.2.1]hept-5-en-2-yl)-2,5,8,11-tetraoxadodecane (NBTODD)

5-(3-methoxybutoxy)methyl-2-norbornene (NB-3-MBM)

5-(3-methoxypropanoxy)methyl-2-norbornene (NB-3-MPM)

-continued

5-(2-(2-ethoxyethoxy)ethyl)bicyclo[2.2.1]hept-2-ene

5-(2-(2-(2-propoxyethoxy)ethoxy)ethoxy)bicyclo[2.2.1]hept-2-ene bicyclo[2.2.1]hept-5-ene-2-carboxylic acid (Acid NB)

3-(bicyclo[2.2.1]hept-5-en-2-yl)propanoic acid (NBEtCOOH)

ethyl 3-(bicyclo[2.2.1]hept-5-en-2-yl)propanoate (EPEsNB)

2-((bicyclo[2.2.1]hept-5-en-2-ylmethoxy)methyl)oxirane (MGENB)

2-(bicyclo[2.2.1]hept-5-en-2-yl)oxirane (ENB)

2-(2-(bicyclo[2.2.1]hept-5-en-2-yl)ethyl)oxirane (EBNB)

2-(4-(bicyclo[2.2.1]hept-5-en-2-yl)butyl)oxirane (EHNB)

2-(6-(bicyclo[2.2.1]hept-5-en-2-yl)hexyl)oxirane (EONB)

3-(bicyclo[2.2.1]hept-5-en-2-yl)-7-oxabicyclo[4.1.0]heptane (CHEPNB)

5-benzylbicyclo[2.2.1]hept-2-ene (BenNB); and 5-phenethylbicyclo[2.2.1]hept-2-ene (PENB)

Again, any of the polymerizable monomer as described herein can be used. Thus, in one of the embodiments the polymer of this invention encompasses one or more repeat units derived from the corresponding monomers selected from the group consisting of:
5-hexylbicyclo[2.2.1]hept-2-ene(HexNB);
5-octylbicyclo[2.2.1]hept-2-ene(OctNB);
5-decylbicyclo[2.2.1]hept-2-ene(DecNB);
5-perfluoroethylbicyclo[2.2.1]hept-2-ene($C_2F_5$NB);
5-n-perfluorobutylbicyclo[2.2.1]hept-2-ene($C_4F_9$NB);
5-perfluorohexylbicyclo[2.2.1]hept-2-ene($C_6F_{13}$NB);
5-benzylbicyclo[2.2.1]hept-2-ene(BenNB);
5-phenethylbicyclo[2.2.1]hept-2-ene(PENB);
2-(4-(bicyclo[2.2.1]hept-5-en-2-yl)butyl)oxirane (EHNB); and
2-(6-(bicyclo[2.2.1]hept-5-en-2-yl)hexyl)oxirane (EONB).

In yet another embodiment the polymer of this invention encompasses one or more repeat units derived from the corresponding monomers selected from the group consisting of:
5-decylbicyclo[2.2.1]hept-2-ene(DecNB);
5-benzylbicyclo[2.2.1]hept-2-ene(BenNB);
5-phenethylbicyclo[2.2.1]hept-2-ene(PENB);
2-(4-(bicyclo[2.2.1]hept-5-en-2-yl)butyl)poxirane (EHNB); and
2-(6-(bicyclo[2.2.1]hept-5-en-2-yl)hexyl)oxirane (EONB).

In a further embodiment, the composition of this invention encompasses a polymer which is a copolymer or a terpolymer containing the respective two or three monomers of formula (I).

Non-limiting examples of such copolymers or terpolymers include:
a copolymer containing repeating units derived from 5-phenethylbicyclo[2.2.1]hept-2-ene (PENB) and 2-(6-(bicyclo[2.2.1]hept-5-en-2-yl)hexyl)oxirane (EONB);
a copolymer containing repeating units derived from 5-phenethylbicyclo[2.2.1]hept-2-ene (PENB) and 2-(4-(bicyclo[2.2.1]hept-5-en-2-yl)butyl)oxirane (EHNB);
a copolymer containing repeating units derived from 5-benzylbicyclo[2.2.1]hept-2-ene (BenNB) and 2-(6-(bicyclo[2.2.1]hept-5-en-2-yl)hexyl)oxirane (EONB);
a copolymer containing repeating units derived from 5-benzylbicyclo[2.2.1]hept-2-ene (BenNB) and 2-(4-(bicyclo[2.2.1]hept-5-en-2-yl)butyl)oxirane (EHNB);
a terpolymer containing repeating units derived from 5-decylbicyclo[2.2.1]hept-2-ene (DecNB), 5-benzylbicyclo[2.2.1]hept-2-ene (BenNB) and 2-(6-(bicyclo[2.2.1]hept-5-en-2-yl)hexyl)oxirane (EONB);
a terpolymer containing repeating units derived from 5-decylbicyclo[2.2.1]hept-2-ene (DecNB), 5-phenethylbicyclo[2.2.1]hept-2-ene (PENB) and 2-(6-(bicyclo[2.2.1]hept-5-en-2-yl)hexyl)oxirane (EONB);
a terpolymer containing repeating units derived from 5-decylbicyclo[2.2.1]hept-2-ene (DecNB), 5-phenethylbicyclo[2.2.1]hept-2-ene (PENB) and 2-(4-(bicyclo[2.2.1]hept-5-en-2-yl)butyl)oxirane (EHNB); and the like.

The polymers employed to form the compositions of this invention generally exhibit a number average molecular weight ($M_w$) of at least about 5,000. In another embodiment, the polymer employed in the composition of this invention has a $M_w$ of at least about 10,000. In yet another embodiment, the polymer employed in the composition of this invention has a $M_w$ of at least about 50,000. In some other embodiments, the polymer of this invention has a $M_w$ of at least about 100,000. In some other embodiments, the polymer of this invention has a $M_w$ ranging from about 100,000 to 500,000. The weight average molecular weight ($M_w$) of the polymer can be determined by any of the known techniques, such as for example, by gel permeation chromatography (GPC) equipped with suitable detector and calibration standards, such as differential refractive index detector calibrated with narrow-distribution polystyrene standards.

Advantageously, the photobase generator used in the composition embodiments in accordance with the present invention, generates a base upon exposure to an effective actinic radiation, where the generated base causes crosslinking of the polymer with other additives thereby fixing the images in the exposed region. In addition, it has now been possible to form high resolution images having up to 25 μm openings.

Accordingly, any of the known photobase generators can be employed in the compositions of this invention which would bring about the above intended change. A representative example of such photobase generator is represented by formula (II):

(II)

Where $R_3$ is ($C_1$-$C_6$)alkyl or ($C_6$-$C_{10}$)aryl($C_1$-$C_6$)alkyl.

Representative examples within the scope of compound of formula (II) without any limitation may be enumerated as follows:
1-benzyloctahydropyrrolo[1,2-a]pyrimidine;
1-(1-phenylpropyl)octahydropyrrolo[1,2-a]pyrimidine;
1-(1-phenylethyl)octahydropyrrolo[1,2-a]pyrimidine, available commercially as CGI-90® from Ciba;
1-(1-(o-tolyl)ethyl)octahydropyrrolo[1,2-a]pyrimidine; and
1-(1-(p-tolyl)ethyl)octahydropyrrolo[1,2-a]pyrimidine.

The amount of PBG useful in composition embodiments in accordance with the present invention is any amount that generates an effective amount of base to initiate the crosslinking reaction, such amount can thus be referred to as an effective amount. For some embodiments, such amount is from 0.1 to 10 parts per hundred parts resin (expressed as pphr) inclusive, based on the weight of the polymer; in other embodiments from 0.5 to 5 pphr inclusive and in still other embodiments, from 1 to 4 pphr inclusive. It will be understood, that for some embodiments of the present invention, it can be advantageous to employ a mixture of PBGs where the effective amount of such mixture is inclusive of the ranges expressed above.

Any of the solvents that can dissolve all of the components of the composition of this invention can be used as a carrier solvent. Representative examples of such solvents include alcohols, such as ethanol, isopropanol, butanols, and the like. Ketone solvents, such as acetone, methyl ethyl ketone (MEK), methyl amyl ketone (MAK), cyclohexanone, cyclopentanone, and the like. Hydrocarbon solvents, such as decane, toluene, p-menthane, and the like. Ester solvents, such as benzyl acetate, ethyl acetate, and the like. Glycol and ether solvents, such as diethylene glycol dimethyl ether, propylene glycol monomethyl ether (PGME), propylene glycol monomethyl ether acetate (PGMEA), and the like. Various other solvents, such as N-methyl-2-pyrrolidone (NMP), gamma-butyrolactone (GBL), N,N-dimethylacetamide, N,N-dimethylformamide (DMF), anisole, methyl 3-methoxypropionate, tetrahydrofuran (THF), 3-ethoxy-1,1,1,2,3,4,4,5,5,6,6,6-dodecafluoro-2-(trifluoromethyl)hexane (HFE-7500), 1,1,1,2,2,3,3,4,4-nonafluoro-4-methoxybutane, 1,1,1,2,2,3,4,4,4-nonafluoro-3-methoxybutane and mixtures in any combination thereof.

In addition, various other additives/components can be added to the composition of this invention, which is used for the formation of the photoimageable layer such that its properties can be tailored as desired. Also, other additives can be used to alter the processability, which include increase the stability of the polymer to thermal and/or light radiation. In this regard, the additives can include, but are not limited to, photosensitizers, antioxidants, adhesion promoters, and the like.

As noted, PBGs generally absorb actinic radiation over a broad range of wavelengths while in modern photoexposure tools, a limited range of wavelengths or even a single wavelength, is provided. Therefore, in addition to a PBG, a photosensitizer can be included within the polymer composition where such material is selected to be absorbing at a wavelength(s) used for the image-wise exposure. While any appropriate photosensitizer can be employed, a useful photosensitizer for exposure at wavelengths that include 248 nanometers includes CPTX of the formula:

1-chloro-4-propoxy-1,9a-dihydro-9H-thioxanthen-9-one (CPTX)

As noted, the compositions of this invention are suitable as negative tone photoimageable compositions. Accordingly, a negative tone component can include compounds that generate a reactant that would cause the crosslinking in the polymer. Such negative tone component can include compounds, such as, but not limited to, a photosensitive free radical generator.

The remaining percentage of the composition not accounted by the photobase generator, photosensitizer, the polymer (e.g., from about 50% to about 99%) and other additives as described hereinbelow can generally be made up with solvent, such as, but not limited to, MAK, mesitylene, N-methyl-2-pyrrolidinone, propylene carbonate, anisole, cyclohexanone, propyleneglycol monomethyl ether acetate, N-butyl acetate, diglyme, ethyl 3-ethoxypropionate, and combinations thereof.

As noted above, the photosensitive composition of this invention further encompasses one or more compounds having utility as, among other things, adhesion promoters, antioxidants, crosslinking, coupling or curing agent, and the like. Non-limiting examples of such compounds are selected from the group consisting of the following, commercially available materials are indicated by such commercial names.

triethoxy(3-(oxiran-2-ylmethoxy)propyl)silane, also commonly known as 3-glycidoxypropyl triethoxysilane (KBE-403 from Shin-Etsu Chemical Co., Ltd.))

trimethoxy(3-(oxiran-2-ylmethoxy)propyl)silane, also commonly known as 3-glycidoxypropyl trimethoxysilane (3-GTS or Silquest® A-187 Silane from Momentive Performance Materials Inc.)

(2-(7-oxabicyclo[4.1.0]heptan-3-yl)ethyl)trimethoxysilane, also known as beta-(3,4-epoxycyclohexyl)ethyltrimethoxysilane (Silquest® A-186 Silane from Momentive Performance Materials Inc.)

((triethoxysilyl)propyl)disulfide (Si-75 or Si-266 from Evonik)

((trimethoxysilyl)propyl)disulfide 2,2'-((2-hydroxy-5-methyl-1,3-phenylene)bis(methylene))bis(4-methylphenol) (Antioxidant 80 from TCI Japan)

-continued

6,6'-methylenebis(2-(2-hydroxy-5-methylbenzyl)-4-methylphenol) (4-PC)

pentaerythritol tetrakis(3-(3,5-di-tert-butyl-4-hydroxyphenyl)propionate) (Irganox 1010 from BASF)

3,5-bis(1,1-dimethylethyl)-4-hydroxy-octadecyl ester benzenepropanoic acid (Iraganox 1076 from BASF)

10H-phenothiazine (Phenothiazine from Kanto)

1,4-bis[(ethenyloxy)methyl]-cyclohexane (Cyclohexane Divinyl ether (CHDVE))

The compositions of this invention can also contain one or more of the crosslinking agents. Any of the crosslinking agents known in the literature that would bring about the crosslinking of the polymer with other additives when the base is generated after photoexposure can be employed in the embodiments of the present invention. Accordingly, in some embodiments of this invention, the photosensitive composition of this invention, without any limitation, contains one or more epoxy compounds selected from the following:

2,2'-(((2-ethyl-2-((oxiran-2-ylmethoxy)methyl)propane-1,3-diyl)bis(oxy))bis(methylene))bis(oxirane), commercially available as Denacol EX321 (Nagase)

(2R,3R,4R,5S)-1,3,5,6-tetrakis(oxiran-2-ylmethoxy)hexane-2,4-diol (also known as tetrakis-O-(oxiranylmethyl)-D-glucitol) (Denacol EX-614 from Nagase)

bis(4-(oxiran-2-ylmethoxy)phenyl)methane (EPON 862® from Momentive Specialty Chemicals Inc.)

Triglycidyl ether of poly(oxypropylene) epoxide ether of glycerol, commercially available as Heloxy 84 from Momentive Specialty Chemicals Inc.

Other exemplary cross-linking or crosslinkable materials that can be used as additives in the forming of a photosensitive composition of the present invention include, among others, bisphenol A epoxy resin, bisphenol F epoxy resin, silicone containing epoxy resins or the like, propylene glycol diglycidyl ether, polypropylene glycol diglycidyl ether, glycidyloxypropyltrimethoxysilane, polymethyl (glycidyloxypropyl)cyclohexane or the like; polymers containing oxazoline rings such as 2-methyl-2-oxazoline, 2-ethyl-2-oxazoline, 1,3-bis(2-oxazoline-2-yl)benzene, 1,4-bis(2-oxazoline-2-yl)benzene, 2,2'-bis (2-oxazoline), 2,6-bis(4-isopropyl-2-oxazoline-2-yl)pyridine, 2,6-bis(4-phenyl-2-oxazoline-2-yl)pyridine, 2,2'-isopropylidenebis (4-phenyl-2-oxazoline), (S,S)-(−)-2,2'-isopropylidenebis (4-tert-butyl-2-oxazoline), poly(2-propenyl-2-oxazoline) or the like; N-methylolacrylamide, N-methylol methacrylamide, furfuryl alcohol, benzyl alcohol, salicyl alcohol, 1,2-benzene dimethanol, 1,3-benzene dimethanol, 1,4-benzene dimethanol and resole type phenol resin or mixtures thereof.

Any amount of epoxy compound can be employed in the photosensitive composition of this invention which brings about the desired crosslinking effect of the total composition. Generally, as noted above, such amount can range from 0 to 70 parts per hundred parts by mass (pphr) of the polymer as described herein. In some other embodiments such amount can range from 10 to 60 pphr. In some embodiments one or more of the epoxy compound as described herein is employed. In another embodiment at least two of the epoxy compounds are employed.

In another aspect of this invention there is further provided a method of forming a film for the fabrication of a microelectronic or optoelectronic device comprising:

coating a suitable substrate with a composition according to this invention to form a film;

patterning the film with a mask by exposing to a suitable radiation;

developing the film after exposure to form a photopattern; and curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 120° C. for from about 1 to 30 minutes, although other appropriate temperatures and times can be used. In some embodiments the substrate is first softbaked before the curing at a temperature of from about 70° C. to about 100° C. for 2 minutes to 10 minutes. After the heating, the film is generally imagewise exposed to an appropriate wavelength of actinic radiation, wavelength is generally selected based on the choice of the photoactive compound employed in the polymer composition as described hereinabove. However, generally such appropriate wavelength is that produced by a mercury vapor lamp which is from 200 to 450 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from the composition in accordance with the present invention, a development process is employed. As noted above, the compositions of this invention function primarily as "negative tone" compositions, that is, the development process removes only unexposed portions of the film thus leaving a negative image of the masking layer in the film.

Suitable developers can include any of the solvents referred to hereinabove as carrier solvents to make the compositions of this invention. A non-limiting example of a suitable developing solvent is a ketone solvent, such as for example MEK or MAK.

Thus some embodiments of the present invention provide self-imageable films that after imagewise exposure, a resulting image is developed using an organic solvent. After the image is developed, the substrate is rinsed to remove excess developer solvent, typical rinse agents are water or appropriate alcohols and mixtures thereof.

Accordingly, in some embodiments the developer employed is an organic solvent which is selected from the group consisting of MEK, MAK, decane, p-menthane, 3-ethoxy-1,1,1,2,3,4,4,5,5,6,6,6-dodecafluoro-2-(trifluoromethyl)hexane (HFE-7500), and mixtures in any combination thereof.

After the aforementioned rinsing, the substrate is dried and the imaged film finally cured. That is to say, the image is fixed. In this step, the photobase generator releases the free base, which facilitates further cross-linking reaction of the remaining polymer material, i.e., exposed region of the composition. The heating is generally carried out at a desirable temperature, for example, from above 110° C. for a time of from several minutes to one or more hours. Where the remaining layer crosslinks with the additive as described herein. Advantageously, it has now been found that such a curing step not only helps in fixing the image, it also reduces the pattern reflow thus enhancing the image resolution.

Accordingly, in some embodiments the resulting imagewise film or layer is cured by heating the patterned and developed substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours.

The devices are produced by using embodiments of the photosensitive resin composition of the present invention to form layers which are characterized as having improved mechanical properties, high heat resistance, an appropriate water absorption rate, high transparency, and low permittivity. In addition, such layers generally have an advantageous coefficient of elasticity after curing.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, including printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Advantageously, it has now been found that the photosensitive compositions of this invention may be useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it may now be possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it may now be possible to form a variety of electronic devices featuring hitherto unachievable level of miniaturization, thinning and light-weight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
DecNB—5-decylbicyclo[2.2.1]hept-2-ene; PENB—5-phenethylbicyclo[2.2.1]hept-2-ene; EONB—2-(6-(bicyclo [2.2.1]hept-5-en-2-yl)hexyl)oxirane; CPTX—1-chloro-4-propoxy-1,9a-dihydro-9H-thioxanthen-9-one; CGI-90—1-(1-phenylethyl)octahydropyrrolo[1,2-a]pyrimidine; A-187 or 3-GTS—trimethoxy(3-(oxiran-2-ylmethoxy)propyl)silane, also commonly known as 3-glycidoxypropyl trimethoxysilane; MAK—methyl amyl ketone; PBG—photobase generator; pphr or phr—parts per hundred parts resin; R. T.—room temperature; LC-MS: liquid chromatography-mass spectroscopy; GPC: gel permeation chromatography; $M_w$—weight average molecular weight; PDI—polydispersity index.

The following examples describe the procedures used for the preparation of various polymers as disclosed herein in the preparation of the compositions of this invention. However, it should be noted that these examples are intended to illustrate the disclosure without limiting the scope thereof.

Polymer Examples

The polymers used to form the photosensitive compositions of this invention are generally known in the literature and are prepared in accordance with the well-known literature procedures as described hereinabove.

Photoimageable Polymer Composition and Imaging Studies

The following Examples illustrate the imageability and crosslinking of the compositions of this invention with a variety of other components as described herein.

Example 1

A terpolymer having the monomer composition of DecNB/PENB/EONB (31/42/27 as measured by $^{13}$C NMR) (100 parts resin), $M_w$=73,800, PDI=2.6, was dissolved in MAK having the specific amounts of additives, expressed as parts per hundred resin (pphr) CGI-90 (5 phr), CPTX (7.5 phr), A-187 (5 phr) were mixed in an appropriately sized amber HDPE bottle with an appropriate amount of MAK as a solvent. The mixture was rolled for 18 hours to produce a homogeneous solution. Particle contamination was removed by filtering the polymer solution through a 0.45 μm pore polytetrafluoroethylene (PTFE) disc filter under 35 psi pressure, the filtered polymer solution was collected in a low particle HDPE amber bottle and the resulting solution stored at 5° C.

Composition thus formed was brought to room temperature and was applied to several 4 inch diameter silicon wafers (thickness: 10 μm) by spin coating at 800 rpm to 1000 rpm for 10 seconds and 3500 rpm to 1000 rpm ramp speed for 30 seconds. The substrate was then placed on a 150° C. hot plate for 5 minutes, providing about a 10 μm thick polymer film. The film was then imagewise exposed through a range of exposure energies from 50-730 mJ/cm². The film was then developed using MAK as a solvent for 2 minutes with no rinse. The wafer was then baked at 150° C. or 170° C. for 4 minutes. All of the imaged and developed wafers were then studied under a microscope.

Various UV exposure conditions along with the post exposure bake (PEB) conditions and the quality of images obtained under each of these conditions are summarized in Table 1.

TABLE 1

| Photoexposure Conditions | PEB | Photoimage Performance |
| --- | --- | --- |
| 3 J/cm² I-line | 150° C., 4 min | Film washed off |
| 3 J/cm² Broadband | 150° C., 4 min | <30 seconds, almost all washed off |
| 5 J/cm² Broadband | 170° C., 4 min | Very poor image pattern |
| 10 J/cm² Broadband | 170° C., 4 min | Few patterns & film peeling |

PEB—post exposure bake

Example 2

The procedures of Example 1 were substantially repeated in this Example 2 except for using a copolymer having the monomer composition of PENB/EONB (40/60), $M_w$=81,500, PDI=2.6. Three silicon wafers were spin coated with the composition and imaged in accordance with the procedures set forth in Example 1 at various exposure doses and wavelength as summarized in Table 2. After developing the images the wafers were post exposure baked at 150° C. for 4 minutes. The quality of the images are summarized in Table 2.

TABLE 2

| Photoexposure Conditions | Photoimage Performance |
| --- | --- |
| 2 J/cm² I-line | Hazy patterns |
| 3 J/cm² I-line | Lines OK, via not so good |
| 1 J/cm² I-line + 3 J/cm² Broadband | Very good patterns up to 25 μm via openings |
| 4 J/cm² Broadband | Very good patterns up to 25 μm via openings |

Figure 1:
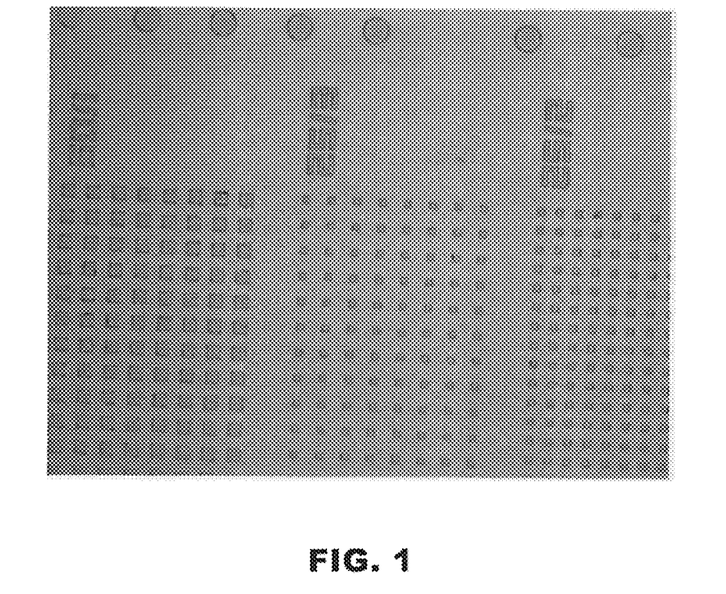
FIGS. 1 and 2 are photolithograph images obtained for a composition embodiment of this invention at different exposure dosages.
Figure 2:
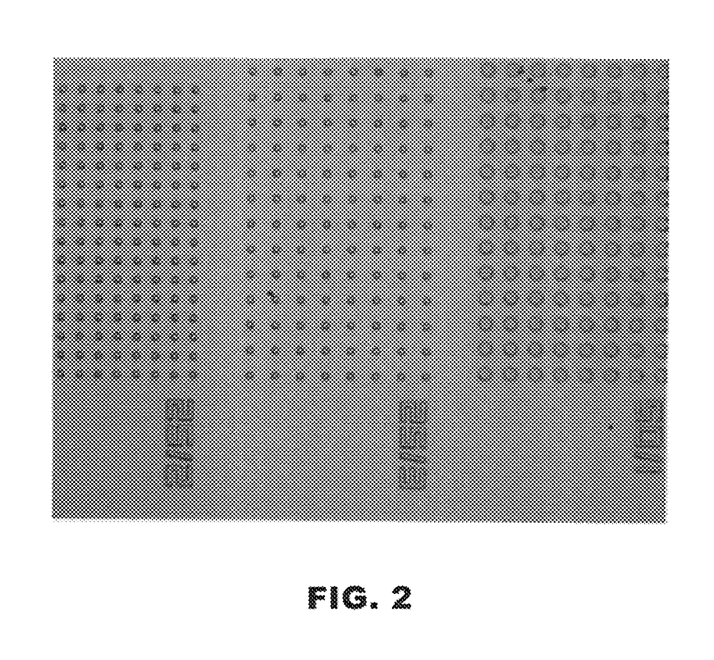

It is evident from the data summarized in Table 2, the composition of Example 2 features good photoimageability at various exposure dosages as summarized therein. The pattern integrity of the images are also shown in FIGS. 1 and 2. FIG. 1 shows the photolithograph of the patterns obtained after exposure to 4 J/cm² Broadband of the film formed on a silicon wafer using the composition of Example 2. It is apparent from FIG. 1 that the 25 μm via openings are readily seen along with overall good photo pattern of the wafer. FIG. 2 shows images obtained from the film using the composition of Example 2 after exposure to an initial exposure dosage of 1 J/cm² at I-line and then a second exposure dosage of 3 J/cm² at Broadband. The overall pattern integrity was still good as evidenced by FIG. 2, and in addition the 25 μm via openings are clearly visible.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A photoimageable solvent developable negative tone composition comprising:
   a) a polymer selected from the group consisting of:
      a copolymer containing repeating units derived from 5-phenethylbicyclo[2.2.1]hept-2-ene (PENB) and 2-(6-(bicyclo[2.2.1]hept-5-en-2-yl)hexyl)oxirane (EONB);
      a copolymer containing repeating units derived from 5-phenethylbicyclo[2.2.1]hept-2-ene (PENB) and 2-(4-(bicyclo[2.2.1]hept-5-en-2-yl)butyl)oxirane (EHNB);
      a copolymer containing repeating units derived from 5-benzylbicyclo[2.2.1]hept-2-ene (BenNB) and 2-(6-(bicyclo[2.2.1]hept-5-en-2-yl)hexyl)oxirane (EONB); and
      a copolymer containing repeating units derived from 5-benzylbicyclo[2.2.1]hept-2-ene (BenNB) and 2-(4-(bicyclo[2.2.1]hept-5-en-2-yl)butyl)oxirane (EHNB);
   b) a photobase generator of formula (II):

(II)

where $R_3$ is $(C_6-C_{10})$aryl$(C_1-C_6)$alkyl; and
   c) a carrier solvent.

2. The composition of claim 1, wherein the polymer is selected from the group consisting of:
   a copolymer containing repeating units derived from 5-phenethylbicyclo[2.2.1]hept-2-ene (PENB) and 2-(6-(bicyclo[2.2.1]hept-5-en-2-yl)hexyl)oxirane (EONB); and
   a copolymer containing repeating units derived from 5-phenethylbicyclo[2.2.1]hept-2-ene (PENB) and 2-(4-(bicyclo[2.2.1]hept-5-en-2-yl)butyl)oxirane (EHNB).

3. The composition of claim 1, wherein the polymer is selected from the group consisting of:
   a copolymer containing repeating units derived from 5-phenethylbicyclo[2.2.1]hept-2-ene (PENB) and 2-(6-(bicyclo[2.2.1]hept-5-en-2-yl)hexyl)oxirane (EONB);
   a copolymer containing repeating units derived from 5-phenethylbicyclo[2.2.1]hept-2-ene (PENB) and 2-(4-(bicyclo[2.2.1]hept-5-en-2-yl)butyl)oxirane (EHNB); and
   a copolymer containing repeating units derived from 5-benzylbicyclo[2.2.1]hept-2-ene (BenNB) and 2-(4-(bicyclo[2.2.1]hept-5-en-2-yl)butyl)oxirane (EHNB).

4. The composition of claim 1, wherein the photobase generator is 1-(1-phenylethyl)octahydropyrrolo[1,2-a]pyrimidine.

5. A photoimageable solvent developable negative tone composition comprising:
   a) a copolymer containing repeating units derived from 5-phenethylbicyclo[2.2.1]hept-2-ene (PENB) and 2-(6-(bicyclo[2.2.1]hept-5-en-2-yl)hexyl)oxirane (EONB);
   b) 1-(1-phenylethyl)octahydropyrrolo[1,2-a]pyrimidine; and
   c) a carrier solvent.

* * * * *